United States Patent [19]
Ferla et al.

[11] Patent Number: 5,933,733
[45] Date of Patent: Aug. 3, 1999

[54] ZERO THERMAL BUDGET MANUFACTURING PROCESS FOR MOS-TECHNOLOGY POWER DEVICES

[75] Inventors: Giuseppe Ferla, Catania; Ferruccio Frisina, Sant'Agata Li Battiati, both of Italy

[73] Assignees: SGS-Thomson Microelectronics, S.r.l., Agrate Brianza; Consorzio Per La Ricerca Sulla Microelettronica Nel Mezzogiorno, Catania, both of Italy

[21] Appl. No.: 08/493,004

[22] Filed: Jun. 21, 1995

[30] Foreign Application Priority Data

Jun. 23, 1994 [EP] European Pat. Off. .............. 94830316

[51] Int. Cl.⁶ ................................................. H01L 21/336
[52] U.S. Cl. .......................... 438/268; 438/138; 438/302; 438/525
[58] Field of Search ................................ 437/29, 40 DM, 437/41 DM, 31, 35, 913, 27; 148/DIG. 126; 438/268, 273, 138, 302, 525

[56] References Cited

U.S. PATENT DOCUMENTS 3,461,360  8/1969  Barson et al. ........................... 317/235
3,909,320  9/1975  Gauge et al. ............................ 437/150

(List continued on next page.)

FOREIGN PATENT DOCUMENTS

| A-0 179 407 | 4/1986 | European Pat. Off. ........ H01L 21/22 |
| A-0 481 153 | 4/1992 | European Pat. Off. . |
| A-51-85381 | 7/1976 | Japan ............................. H01L 29/78 |
| 53-102668 | 9/1978 | Japan ........................................ 437/35 |
| 62-51216 | 3/1987 | Japan . |
| 62-131579 | 6/1987 | Japan . |
| 03105978 | 5/1991 | Japan ................................ 437/41 DM |
| 3241747 | 10/1991 | Japan ....................................... 437/35 |
| 4-65132 | 3/1992 | Japan . |
| 0536719 | 2/1993 | Japan ....................................... 437/35 |
| 5-129602 | 5/1993 | Japan . |

OTHER PUBLICATIONS

IEEE Journal of Solid–State Circuits, vol. SC–11, No. 5, Oct. 1976, Michael D. Pocha, et al., "A Computer–Aided Design Model for High–Voltage Double Diffused MOS (DMOS) Transistors", pp. 718–726.

Proceedings of the 1st Conference on Solid State Devices, Tokyo 1969, Supplement to the Journal of The Japan Society of Applied Physics, vol. 39, 1970, Y. Tarui, et al., "Diffusion Self–Aligned MOST A New Approch for High Speed Device"; pp. 105–110.

(List continued on next page.)

*Primary Examiner*—Michael Trinh
*Attorney, Agent, or Firm*—Wolf, Greenfield & Sacks, P.C.

[57] ABSTRACT

A zero thermal budget manufacturing process for a MOS-technology power device. The method comprises the steps of: forming a conductive insulated gate layer on a surface of a lightly doped semiconductor material layer of a first conductivity type; removing the insulated gate layer from selected portions of the semiconductor material layer surface; implanting a first dopant of a second conductivity type into the selected portions of the semiconductor material layer, the insulated gate layer acting as a mask and the first dopant of the first conductivity type being implanted in a dose and with an implantation energy suitable to obtain heavily doped regions substantially aligned with the edges of the insulated gate layer; implanting a second dopant of the second conductivity type along directions at prescribed angles with respect to a direction orthogonal to the semiconductor material layer surface, the insulated gate layer acting as a mask, the second dopant being implanted in a dose and with an implantation energy suitable to obtain lightly doped channel regions extending under the insulated gate layer; and implanting a third dopant of the first conductivity type into the heavily doped regions, to form source regions substantially aligned with the edges of the insulated gate layer.

53 Claims, 3 Drawing Sheets

U.S. PATENT DOCUMENTS

| | | | |
|---|---|---|---|
| 4,001,860 | 1/1977 | Cauge et al. | 257/336 |
| 4,190,850 | 2/1980 | Tihanyi et al. | 257/336 |
| 4,417,385 | 11/1983 | Temple | 437/35 |
| 4,502,205 | 3/1985 | Yahano | 437/29 |
| 4,593,302 | 6/1986 | Lidow et al. | 257/342 |
| 4,680,853 | 7/1987 | Lidow et al. | 437/38 |
| 4,705,759 | 11/1987 | Lidow et al. | 437/41 DM |
| 4,716,126 | 12/1987 | Cogan | 437/24 |
| 4,931,408 | 6/1990 | Hshieh | 437/44 |
| 5,023,191 | 6/1991 | Sakurai | 437/27 |
| 5,374,571 | 12/1994 | Mukherjee et al. | 437/29 |
| 5,382,538 | 1/1995 | Zambrano et al. | 148/DIG. 126 |
| 5,397,728 | 3/1995 | Sasaki et al. | 437/41 DM |

OTHER PUBLICATIONS

IEEE Journal of Solid–State Circuits, vol. SC–10, No. 5, Oct. 1975, T.J. Rodgers, et al., "An Experimental and Theoretical Analysis of Double–Diffused MOS Transistors"; pp. 322–331.

Microelechonik 4, Munich, Nov. 1970, Y. Tarui, et al., "Diffusion Self–Aligned MOST and Lateral Transistor"; pp. 102–129.

The Theory and Practice of Microelectronics, Chapters, 4, 6, 7, 8, 10, 13 and 15; Ghandi, 1968.

Integrated Circuits Laboratory, Stanford Electronics Laboratories, Stanford University, Technical Report No. 4956–1, Mar. 1976, Michale D. Pocha, "High Voltage Double Diffused MOS Transistors for Integrated Circuits"; pp. 1–244.

Intel Corporation, Mountain View, University of California, Berkeley, John Wiley & Sons, A.S. Grove, "Physics and Technology of Semiconductor Devices"; Chapters 3, 4, 6, 8–10, 1977.

European Search Report from European Patent Application No. 94830316.9, filed Jun. 23, 1994.

Ajit et al; "The Minority Carrier Injection Controlled Field–Effect Transistor (MICFET): A New MOS–Gated Power Transistor Structure", IEEE Transaction on Electron Devices vol. 39, No. 8, Aug. 1992, pp. 1954–1960.

ZERO THERMAL BUDGET MANUFACTURING PROCESS FOR MOS-TECHNOLOGY POWER DEVICES

BACKGROUND OF THE INVENTION

1. Field of the Invention

The present invention relates to a zero thermal budget manufacturing process for MOS-technology power devices, such as power MOSFETs and Insulated Gate Bipolar Transistors (IGBTs).

2. Discussion of the Related Art

MOS-technology power devices are made up of a plurality of elementary functional units connected in parallel to each conduct a fraction of the overall power device current.

Each elementary unit comprises a "body region" of one conductivity type (P type for an N-channel device), formed in a lightly doped semiconductor layer of an opposite conductivity type (N type) common to all the functional units. A heavily doped source region of the opposite conductivity type (N type) is provided inside the body region. A portion of the body region between the source region and the edge of the body region itself is covered by a thin oxide layer (the "gate oxide") and by a polysilicon layer (the "gate layer") and forms a channel region of the elementary functional unit. The source regions of the elementary functional units are contacted by a same metal layer which comprises a source electrode of the power device. Typically, the body regions have a square plan, and the power device is made up of a bidimensional array of square-plan elementary cells.

Conventionally, the body region comprises a central heavily doped region, (sometimes called the "deep body region"), and a lateral lightly doped channel region. A source region has an annular shape and is formed in the lateral channel region, substantially around the deep body region.

The source metal layer which contacts the source region also contacts the deep body region of the elementary cells to short-circuit the base-emitter junction of a parasitic bipolar junction transistor (BJT) having emitter, base and collector respectively represented by the source region, the portion of the body region under the source region, and the lightly doped semiconductor layer (an NPN transistor in the case of an N-channel power device).

A conventional manufacturing process includes: (1) epitaxially growing a lightly doped semiconductor layer of a first, e.g. N, conductivity type over a heavily doped substrate of the N conductivity type, in the case of a power MOSFET, or of the P conductivity type, in the case of an IGBT; (2) implanting, by use of a mask, and diffusing a heavy dose of a P type dopant into selected regions of the N type layer, to form the deep body regions of the elementary cells; (3) thermally growing a thin oxide layer over the surface of the N type layer; (4) depositing a polysilicon layer over the thin oxide layer; (5) selectively etching the polysilicon layer and the thin oxide layer around the deep body regions; (6) implanting a low dose of a P type dopant using the polysilicon and oxide layers as a mask; (7) diffusing the P type dopant to form channel regions extending under the thin oxide layer; and (8) implanting, by use of a mask, a heavy dose of an N type dopant into the deep body and channel regions of the cells to form annular source regions.

The doping level of the deep body regions should be suitable to obtain low-resistance contact regions for the body regions, while the doping level of the channel regions is adjusted on the basis of the threshold voltage value desired for the power device. Typical implantation doses are in the range of $10^{13}$–$10^{14}$ atoms/cm$^2$ for the channel regions, and $10^{15}$ atoms/cm$^2$ for the deep body regions. Three distinct masks are necessary to introduce the dopants for the various regions of the elementary cells. The windows opened in the implantation mask for the deep body regions are smaller than the windows opened by etching in the polysilicon and oxide layers to avoid lateral diffusion of the deep body regions during the thermal steps which can alter the doping profile of the channel regions. The source regions are implanted in a self-aligned way with the edges of the windows in the polysilicon and thin oxide layers, but the implantation mask must further provide unexposed surface regions in the middle of the deep body regions.

The source region may extend a significant distance into the channel region. Since the channel region has a relatively high sheet resistance (in the range of 600 ohm/square), the short-circuit of the base-emitter junction of the parasitic bipolar transistor becomes less effective with the increase in the lateral distance from the deep body region because a resistor is introduced between the emitter and the base regions of the parasitic transistor, which lowers the breakdown voltage of the power device. It would be therefore desirable to make the deep body region extend as far as possible under the source region. The problem is that, due to the lateral diffusion of the deep body region dopants during the thermal steps of the fabrication process, the dopant profile in the channel region could be altered. Thus, in conventional MOS-technology power devices, the region near the edge of the source region to the channel region of the elementary cells is critical from the point of view of the parasitic transistor triggering on.

In a commonly assigned, co-pending patent application filed on even date herewith, a manufacturing process is described which includes: (1) epitaxially growing a lightly doped semiconductor layer of a first, e.g. N, conductivity type over a heavily doped substrate of the N conductivity type, in the case of a power MOSFET, or of the P conductivity type, in the case of an IGBT; (2) thermally growing a thin oxide layer over the surface of the N type layer; (3) depositing a polysilicon layer over the thin oxide layer; (4) selectively etching the polysilicon layer and the thin oxide layer to remove them from selected portions of the N type layer surface; (5) implanting a heavy dose of a P type dopant into the selected surface portions with the polysilicon and thin oxide layers acting as a mask using an implantation energy which is sufficiently high to locate the peak dopant concentration at a prescribed distance from the surface; (6) performing a diffusion step with an amount of thermal energy large enough to cause the dopants to diffuse upwards and laterally to form heavily doped body region portions self-aligned with the edges of the polysilicon and the thin oxide layers, and lightly doped channel regions which extend laterally under the thin oxide layer; and (7) selectively implanting a heavy dose of an N type dopant to form source regions self-aligned with the polysilicon and thin oxide layers edges, and therefore substantially contained in the heavily doped body region portions.

This process not only uses one mask less than the conventional process, but also obtains source regions almost completely included in the heavily doped portion of the body regions, so that the base series resistance of the parasitic BJT is quite small along all the source region.

However, the thermal process necessary to make the dopants diffuse requires heating the device to temperatures of about 1100 C° for at least 1 hour to allow the dopants to diffuse upwards and laterally, so the thickness of the gate oxide cannot be scaled down below 350–500 Angstroms.

Furthermore, due to the method by which the channel region is formed (i.e., by diffusion) the channel is inevitably long (typically about 1 μm). Long channels result in low conductivity and thus high "on" resistances. Also due to the lateral diffusion technique used for the formation of the channel, the dopant concentration of the channel decreases in a direction moving away from the source region, and the channel resistance increases.

SUMMARY OF THE INVENTION

The aforementioned problems of the prior art are overcome by an illustrative embodiment of the present invention which provides a zero thermal budget process for manufacturing a MOS-technology power device, comprising the steps of: (a) forming a conductive insulated gate layer on a surface of a lightly doped semiconductor material layer of a first conductivity type; (b) removing the insulated gate layer from selected portions of the semiconductor material layer surface; (c) implanting a first dopant of a second conductivity type into the selected portions of the semiconductor material layer, the insulated gate layer acting as a mask, in a dose and with an implantation energy suitable to obtain heavily doped regions substantially aligned with the edges of the insulated gate layer; (d) implanting a second dopant of the second conductivity type along directions tilted at prescribed angles with respect to a direction orthogonal to the semiconductor material layer surface, the insulated gate layer acting as a mask, in a dose and with an implantation energy suitable to obtain lightly doped channel regions extending under the insulated gate layer; and (e) implanting a first dopant of the first conductivity type into the heavily doped regions to form source regions substantially aligned with the edges of the insulated gate layer.

In a manufacturing process according to the present invention, the deep body and channel portions of the body regions are formed by implantation without thermal diffusion steps. The channel regions of the elementary functional units can thus be made shorter than in conventional processes since the dopants are implanted in their desired locations with their desired concentrations by adjusting the implantation energy and dose. The dimensions of the channel regions are thus highly controlled.

Since no high thermal processes are required, the gate oxide thickness can be reduced from the current 350–500 Angstroms to 100–200 Angstroms. For the same reason, junction depths are smaller, so that thinner epitaxial layers can be grown. This results in a decrease of the "on" resistance of the power device. Moreover, fewer masks are required compared to many of the known processes.

BRIEF DESCRIPTION OF THE DRAWINGS

These and other features of the present invention will be made more evident by the following detailed description of a particular embodiment, illustrated as a non-limiting example in the annexed drawings, in which.

DETAILED DESCRIPTION

Figure 1:
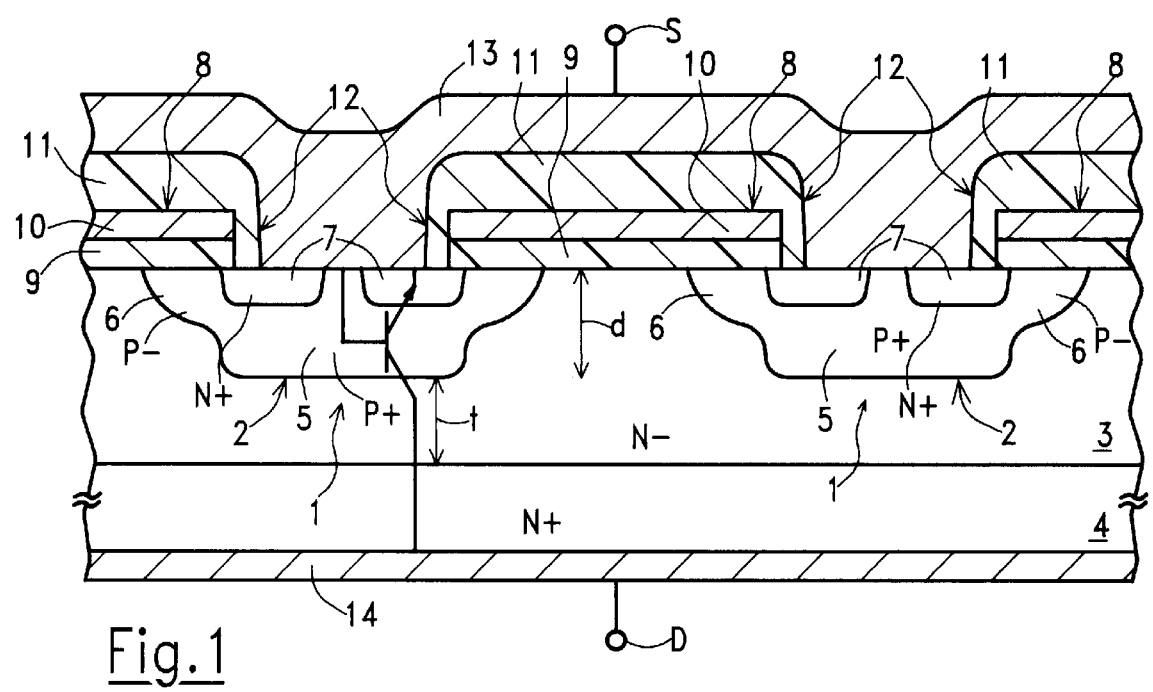
FIG. 1 is a cross-sectional view of a MOS-technology power device according to the present invention.

FIG. 1 shows a cross-section of a power MOSFET. The power MOSFET is made of a plurality of elementary functional units 1, each comprising a P type body region 2 formed in a lightly doped N type ("N−") epitaxial layer 3 grown over a heavily doped N type ("N+") substrate 4. The elementary functional units are, for example, represented by square-plan elementary cells.

The P type body region 2 of each elementary cell 1 comprises a first, heavily doped ("P+") portion 5, and a second, more lightly doped ("P−") lateral portion 6 forming a channel region of the elementary cell 1. Each cell 1 also comprises an N+ source region 7 formed in the heavily doped portion 5 of the body region 2 and having an annular shape.

An insulated gate layer 8, comprising a thin gate oxide layer 9 and a polysilicon gate layer 10, extends between adjacent elementary cells 1 and covers the surface of the channel region 6 of the body region 2. The heavily doped portion 5 of the body region and the source region 7 are both substantially aligned with the edges of the insulated gate layer 8.

The insulated gate layer 8 is covered by an insulation layer 11 such as PVapox. Contact windows 12 are opened in layer 11 over the source region 7 and the heavily doped portion 5 of the body region 2 to allow a superimposed metal layer 13 to contact them. The metal layer 13 contacts all the elementary cells and forms a source electrode S of the power MOSFET. A drain electrode D is also formed by covering the bottom surface of the substrate 4 by a metal layer 14.

Since the source region 7 is almost completely internal to the heavily doped portion 5 of the body region 2, the base series resistance of the parasitic vertical BJT having emitter and base represented by the source region 7 and the underlying portion of the body region 2 is negligible even near the external edge of the source region. The base/emitter junction of such parasitic BJT is thus effectively short-circuited by the metal layer 13 which prevents the parasitic BJT from being triggered on. Thus, the breakdown voltage of the power MOSFET is not reduced.

A manufacturing process according to the present invention starts with the epitaxial growth of a lightly doped N type layer 3 over a heavily doped N type substrate 4.

Figure 2:
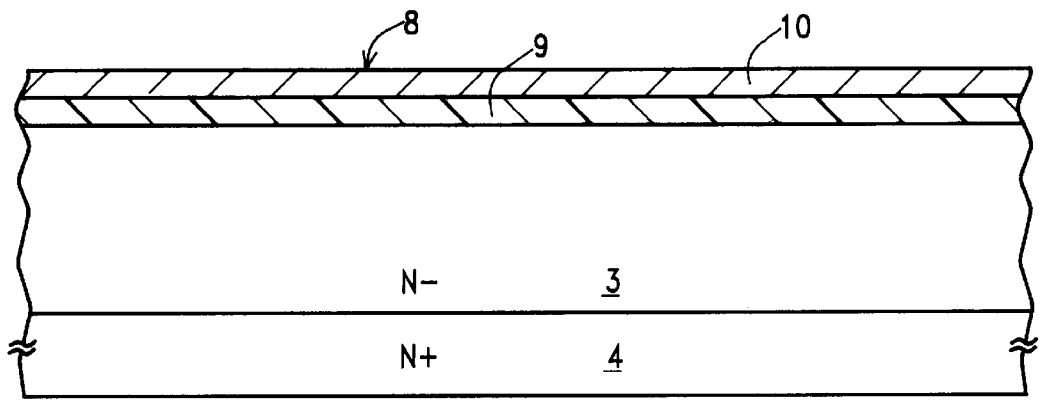

The surface of the N− layer 3 is then covered by a thin gate oxide layer 9 (e.g., thermally grown). The gate oxide layer 9 can be as thin as 100–200 Angstroms. A polysilicon gate layer 10 is then formed (e.g., by deposition) over the gate oxide layer 9. The two layers 9 and 10 form an insulated gate layer 8 (FIG. 2).

Figure 3:
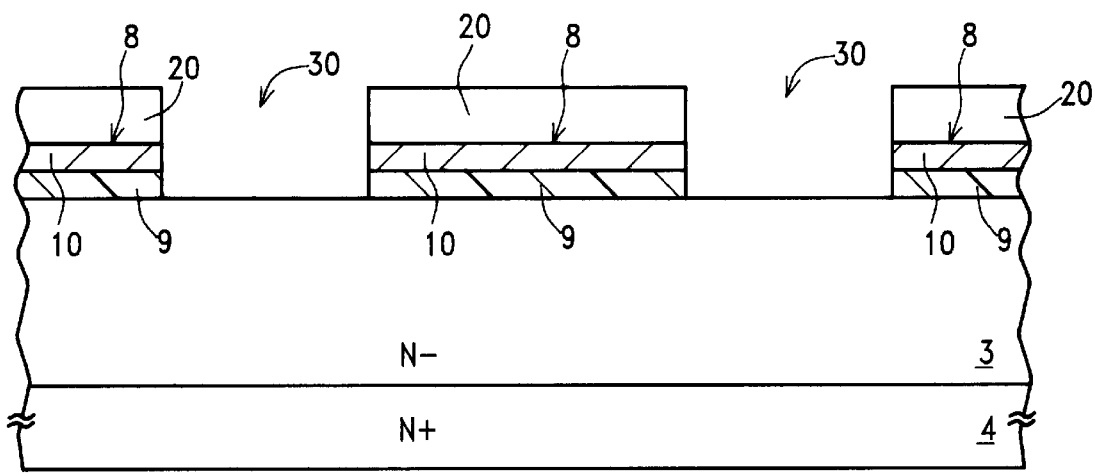

The insulated gate layer 8 (i.e., the polysilicon layer 10 and the gate oxide layer 9) is then selectively removed from the surface of the N− layer 3 to open a plurality of windows 30 which, in the present example, have a square plan. This step is performed by covering the insulated gate layer 8 with a photoresist 20, and removing photoresist 20 from the regions of the insulated gate layer surface which are to be exposed to the action of an etchant with high reactivity towards polysilicon and silicon dioxide relative to the photoresist material 20 (FIG. 3).

Figure 4:
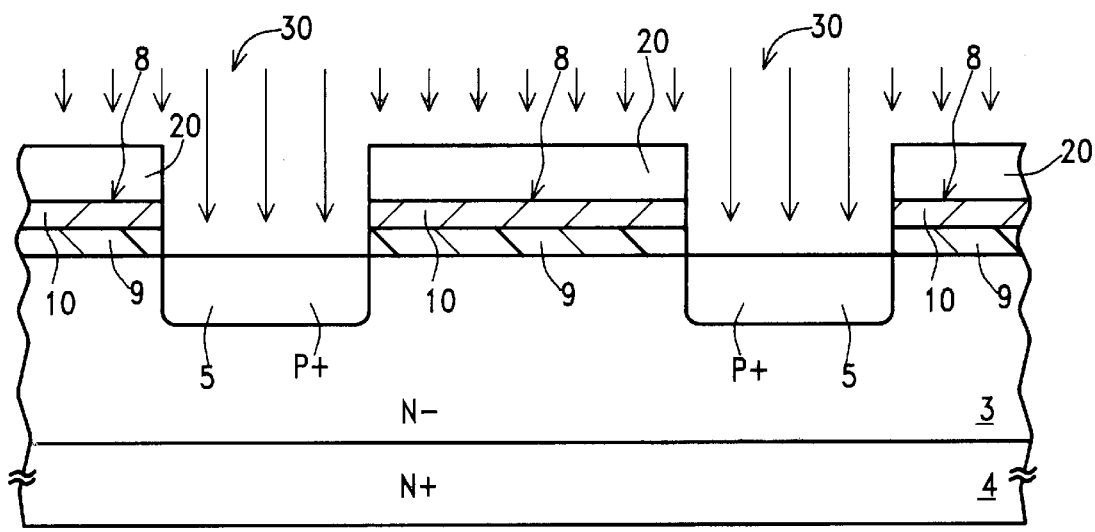

A P type dopant (such as boron) is then selectively implanted into the N− layer 3 through the windows 30, the insulated gate layer 8 acting as a mask for the implanted dopant ions. The dopant distribution is thus laterally self-aligned with the edges of the insulated gate layer 8. The dopant dose and the implantation energy are chosen so that heavily doped regions 5 are obtained without any thermal diffusion step (FIG. 4). A suitable dopant dose can be $10^{14}$–$10^{15}$ atoms/cm$^2$. The implantation energy is such that the peak concentration of dopant is located at a prescribed distance from the surface of the N− layer 3.

Figure 5:
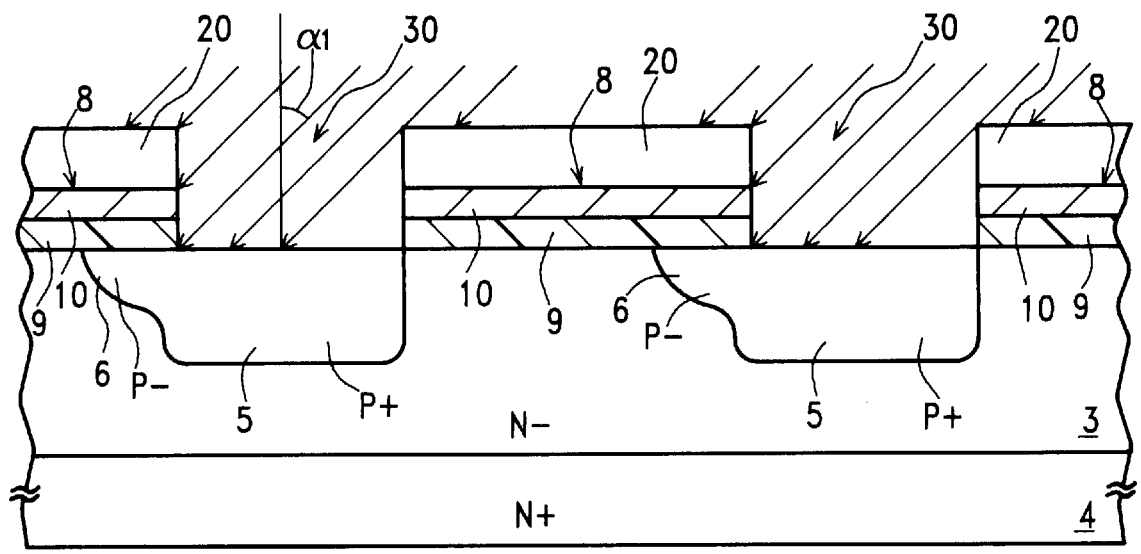
Figure 6:
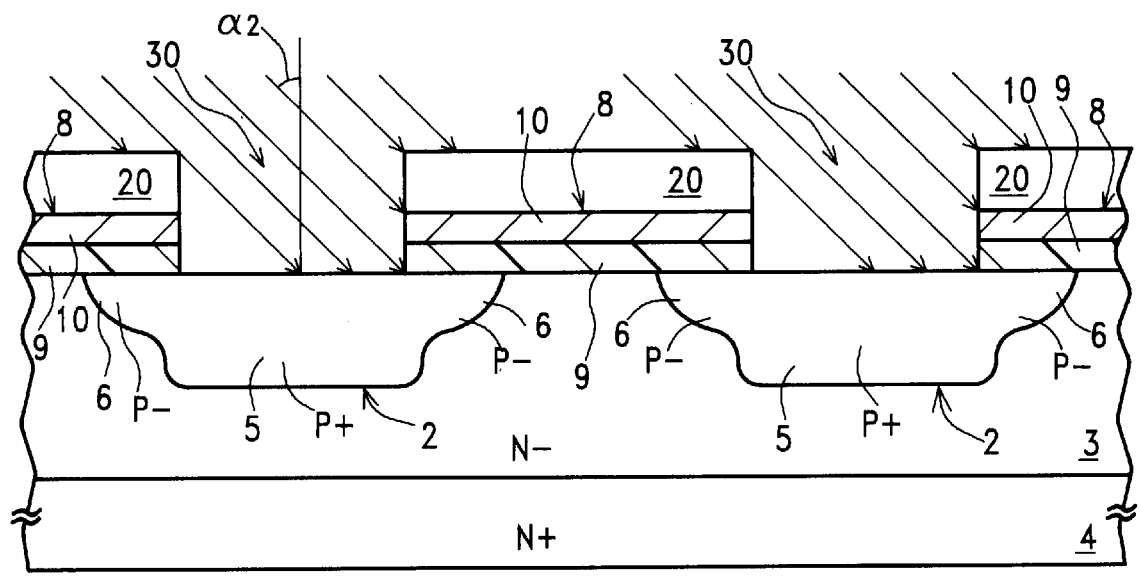

A P type dopant is selectively implanted into the N− layer 3 through the windows 30 by tilting the dopant ion beam at an angle $\alpha_1$ with respect to the direction orthogonal to the surface of the N− layer 3. This can be done using one of the commercially available implanters, such as the Eaton 8200 P, which allow tilt angles ranging from 0° to approximately 60°. In the present example, a tilt angle in the range 35°–60°, preferably 45°, is suitable. The implantation mask is again provided by the insulated gate layer 8. The dopant ions are thus implanted under the thin oxide layer 9 in a region near one of the edges of the insulated gate layer 8 (FIG. 5). This step is then repeated tilting the dopant ion beam of an angle $\alpha_2$, for example 45°, in the opposite direction, to implant the dopant ions under the thin oxide layer 9 in a region near the opposite edge of the insulated gate layer 8 (FIG. 6). This process is repeated until the dopant has been implanted under all the edges of the insulated gate layer 8. In the case of square-plan elementary cells, wherein the insulated gate layer 8 has four edges around each heavily doped region 5, four implantation steps may be used to form four P type channel regions 6 around the heavily doped regions 5, under the edges of the insulated gate layer 8. The dopant dose and the implantation energy are chosen on the basis of the desired threshold voltage of the power MOSFET, and of the desired channel length. A suitable dose is, for example, $10^{12}$–$10^3$ atoms/cm$^2$ and the implantation energy can be 100–200 KeV. It is to be noted that the channel regions 6 do not extend around the corners of the windows 30.

Figure 7:
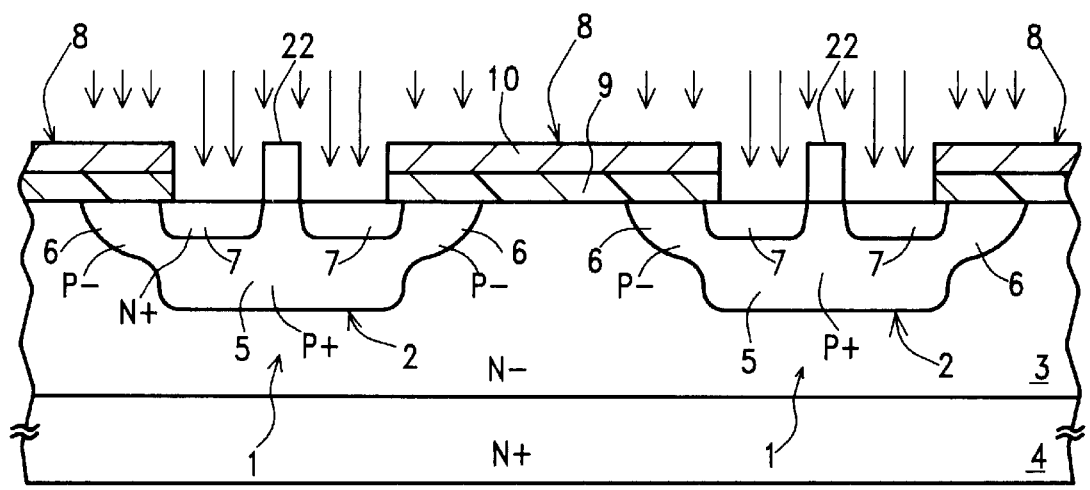
FIGS. 2 to 7 are cross-sectional views of the power device taken at intermediate steps of the fabrication process according to the invention.

A heavy dose of an N type dopant is then selectively introduced into the heavily doped regions 5, for example by ion implantation. The implantion mask is provided in part by the insulated gate layer 8, but should further comprise photoresist isles 22 in the middle of the heavily doped regions 5 to prevent the ions from being implanted in the central portions of the regions 5 which will be contacted by a metal layer (FIG. 7). It is also desirable to prevent the N type dopant from being implanted near the corners of the windows 30 in the insulated gate layer 8. To avoid the source regions 7 being in direct contact with the N-layer 3 (i.e., to avoid a source-drain short-circuit). This can be done by covering the four corners of the windows 30 with a photoresist. Annular source regions 7, self-aligned with the insulated gate layer 8 and substantially internal to the heavily doped regions 5, are thus formed.

A high temperature, low time duration thermal step is performed to activate the dopants and to partially remove defects caused by the implantation of dopants. This step is performed in Rapid Thermal Annealers (RTAs), and does not cause significant dopant redistribution. The doping profiles and dimensions of the various regions of the elementary cells 1 are thus not affected by the thermal treatment.

An insulation layer 11 is formed over the insulated gate layer 8 and is selectively removed to open contact windows 12 over the elementary cells. The insulation layer 11 is covered by a metal layer 13 which contacts the source region 7 and the heavily doped region 5 of all the elementary cells 1. A metal layer 14 is also formed on the bottom surface of the N+ substrate 4.

The manufacturing process according to the invention has a further advantage over the conventional processes. It is known that the power MOSFET breakdown voltage depends on the thickness t of the portion of the N− layer 3 between the N+ substrate 4 and the P+ regions 5. For example, for low-voltage devices which must withstand 60 V between drain and source, this portion must be at least 3.5 µm thick. Since in conventional processes the depth d of the heavily doped regions 5 is not less than 4 µm, an epitaxial layer of at least 7.5 µm thickness (t+d) is necessary. A process according to the present invention not involving thermal steps with high thermal budgets (i.e., high temperatures and long duration), allows junctions with smaller depths to be obtained. In particular, the depth d of the junction between the heavily doped portions 5 of the body regions 2 and the N− layer 3 can be reduced to 0.6 µm. The overall thickness t+d of the epitaxial layer necessary to assure 60 V of breakdown voltage is thus reduced to 4.1 µm. As a consequence, the length of the vertical JFET represented by the portion of the epitaxial layer comprised between the body region 2 of two adjacent elementary cells is thus reduced. This makes it possible to lower the "on" resistance of the power MOSFET. Alternatively, it is possible to fabricate much more dense power MOSFETs with "on" resistances substantially equal to the conventional ones, thereby reducing the distance between adjacent elementary cells 1.

In a manufacturing process according to the present invention, the deep body and channel portions of the body regions are formed by implantation without thermal diffusion steps. The channel regions of the elementary functional units can thus be made shorter than in conventional processes since the dopants are implanted in their desired locations with their desired concentrations by adjusting the implantation energy and dose. The dimensions of the channel regions are thus highly controlled.

Since no high thermal processes are required, the gate oxide thickness can be reduced from the current 350–500 Angstroms to 100–200 Angstroms. For the same reason, junction depths are smaller, so that thinner epitaxial layers can be grown. This results in a decrease of the "on" resistance of the power device. Moreover, fewer masks are required compared to many of the known processes.

A process according to the present invention may apply as well to the fabrication of IGBTs, the only difference being the conductivity type of the substrate 4. Furthermore, the process according to the present invention is not limited to MOS-technology power devices made up of arrays of square-plan elementary cells as those previously described, but extends to high-density devices made up of a plurality of elementary functional units, wherein the body regions are elongated stripes with one dimension much greater than the other. Such a device is described in co-pending European Patent Application No. 94830288.0. In this case, windows 30 in insulated gate layer 8 are substantially rectangular. Channel regions 6 are present under the long edges of insulated gate layer 8, so that their formation requires only two tilted implantation steps instead of four.

Having thus described several embodiments of the present invention, various alterations, modifications and improvements will readily occur to those skilled in the art. Such alterations, modifications and improvements are intended to be within the spirit and scope of the invention. The materials employed, as well as their shapes and dimensions, may be any required. Accordingly, the foregoing description is by way of example only and is not intended as limiting. The invention is limited only as defined in the following claims and the equivalents thereto.

What is claimed is:

1. A zero thermal budget process for manufacturing a MOS-technology power device, comprising the steps of:

(a) forming an insulated gate layer on a surface of a doped semiconductor material of a first conductivity type, the doped semiconductor material being disposed on a semiconductor substrate, the insulated gate layer being formed from a gate oxide layer and a polysilicon gate layer;

(b) removing portions of the insulated gate layer to expose selected portions of the surface of the doped semiconductor material layer, the insulated gate layer having edges outlining the selected portions of the surface of the doped semiconductor material;

(c) implanting a first dopant of a second conductivity type into the selected portions of the doped semiconductor material layer with the insulated gate layer and a layer of photoresist acting as a mask to form an implanted first dopant, the first dopant being implanted with a dose and an implantation energy to obtain first doped regions aligned with the edges of the insulated gate layer, the first doped regions having a concentration of the implanted first dopant and being formed without requiring thermal diffusion of the implanted first dopant;

(d) implanting a second dopant of the second conductivity type into the selected portions of the doped semiconductor material layer along directions at angles relative to a direction orthogonal to the surface of the doped semiconductor material layer with the insulated gate layer acting as a mask to form an implanted second dopant, the second dopant being implanted with a dosed and an implantation energy to obtain channel regions extending under the insulated gate layer and having a thickness less than the first doped regions, the channel regions having a concentration of the implanted second dopant that is less than the concentration of the implanted first dopant of the first doped regions, the channel regions being formed without requiring thermal diffusion of the implanted second dopant; and (e) implanting a dose of a third dopant of the first conductivity type into the first doped regions to form source regions aligned with the edges of the insulated gate layer.

2. The process according to claim 1, wherein step (d) includes implanting the second dopant at an angle in a range from approximately 35° to approximately 60° relative to a direction orthogonal to the surface of the doped semiconductor material layer.

3. The process according to claim 2, wherein step (d) includes implanting the second dopant with a dose in a range of approximately $10^{12}$ to approximately $10^{13}$ atoms/cm$^2$ and an energy of from approximately 100 to approximately 200 KeV.

4. The process according to claim 1, further comprising the steps of:

(f) covering the insulated gate layer and the selected portions of the surface of the doped semiconductor material layer with an insulating material layer;

(g) opening contact windows in the insulating material layer over the selected portions of the surface of the doped semiconductor material layer; and (h) covering the insulating material layer with a conductive material layer.

5. The process according to claim 1, wherein step (a) includes forming the insulated gate layer by growing a thin oxide layer over the surface of the doped semiconductor material layer and covering the thin oxide layer with a conductive material layer.

6. The process according to claim 1, further comprising, before step (a), a step of epitaxially growing the doped semiconductor material layer over the semiconductor substrate, the semiconductor substrate having a dopant concentration greater than the dopant concentration of the doped semiconductor material layer.

7. The process according to claim 6, including a step of, before step (a), providing the semiconductor substrate as the first conductivity type so that the power device is a power MOSFET.

8. The process according to claim 6, including a step of, before step (a), providing the semiconductor substrate as the second conductivity type so that the power device is an IGBT.

9. The process according to claim 1, wherein:

step (a) includes forming a insulated gate layer on a surface of an N type semiconductor material layer;

step (c) includes implanting a first P type dopant;

step (d) includes implanting a second P type dopant; and step (e) includes implanting an N type dopant.

10. The process according to claim 1, wherein:

step (a) includes forming an insulated gate layer on a surface of a P type semiconductor material layer;

step (c) includes implanting a first N type dopant;

step (d) includes implanting a second N type dopant; and step (e) includes implanting a P type dopant.

11. The process according to claim 1, wherein step (d) includes implanting the second dopant with a dose in a range of approximately $10^{12}$ to approximately $10^{13}$ atoms per square centimeter.

12. The process according to claim 11, wherein step (d) includes implanting the second dopant with a an energy of from approximately 100 KeV to approximately 200 KeV.

13. The process according to claim 1, wherein step (d) includes implanting the second dopant with a an energy of from approximately 100 KeV to approximately 200 KeV.

14. The process according to claim 2, wherein step (d) includes implanting the second dopant with a dose in a range of approximately $10^{12}$ to approximately $10^{13}$ atoms per square centimeter.

15. The process according to claim 2, wherein step (d) includes implanting the second dopant with a an energy of from approximately 100 KeV to approximately 200 KeV.

16. A process for manufacturing a semiconductor device, comprising the steps of:

(a) forming a layer of a semiconductor material of a first conductivity type on a semiconductor substrate, the layer of the semiconductor material having a surface;

(b) forming portions of an insulated gate material and a photoresist material on portions of the surface of the layer of the semiconductor material to form covered portions of the surface of the layer of the semiconductor material and exposed portions of the surface of the layer of the semiconductor material, the insulated gate material being formed from a gate oxide material and a polysilicon gate material (c) disposing at least a portion of a doped region of a second conductivity type within the layer of the semiconductor material so that the portion of the doped region disposed within the layer of the semiconductor material extends into the layer of the semiconductor material a distance less than 4 $\mu$m from the surface of the layer of the semiconductor material, the doped region having a first dopant concentration and being formed without thermal diffusion of a dopant;

(d) forming a channel region of a second conductivity type within the layer of the semiconductor material, the channel region extending under the insulated gate material and having a thickness less than the doped region, the channel region having a second dopant concentration and being formed without thermal diffusion of a dopant, the second dopant concentration being less than the first dopant concentration.

17. The process according to claim 16, wherein step (b) includes disposing the portion of the doped region within the layer of the semiconductor material so that the portion of the doped region disposed within the layer of the semiconductor material extends into the layer of the semiconductor material a distance of about 0.6 µm from the surface of the layer of the semiconductor material.

18. The process according to claim 16, further comprising a step of:
   (e) forming a source region of the first conductivity type within the doped region.

19. The process according to claim 18, wherein steps (c) and (d) include implanting dopants of the second conductivity type within the layer of the semiconductor material through the exposed portions of the layer of the semiconductor material so that the doped region and the channel region form a body region, the doped region and the channel region intersecting at a boundary that is aligned with an edge of one of the portions of the insulated gate material, and wherein step (e) includes implanting dopants of the first conductivity type within the layer of the semiconductor material through the exposed portions of the layer of the semiconductor material so that the source region has an edge extending from the surface of the layer of the semiconductor material that is aligned with the edge of the one of the portions of the insulated gate material.

20. The process according to claim 18, wherein step (d) includes forming the channel region by implanting dopants of the second conductivity type through the exposed portions of the layer of the semiconductor material at an angle in a range from approximately 30° to approximately 55° with respect to the surface of the layer of the semiconductor material.

21. The process according to claim 18, wherein step (e) includes forming the channel region by implanting dopants of the second conductivity type with a dose of from approximately $10^{12}$ to approximately $10^{13}$ approximately atoms/cm$^2$.

22. The process according to claim 18, wherein step (e) includes forming the channel region by implanting dopants of the second conductivity type with an energy from approximately 100 KeV to approximately 200 KeV.

23. The process according to claim 16, wherein step (d) includes implanting a dopant of the second conductivity type with a dose in a range of approximately $10^{12}$ to approximately $10^{13}$ atoms per square centimeter.

24. The process according to claim 23, wherein step (d) includes implanting a dopant of the second conductivity type with a an energy of from approximately 100 KeV to approximately 200 KeV.

25. The process according to claim 16, wherein step (d) includes implanting a dopant of the second conductivity type with a an energy of from approximately 100 KeV to approximately 200 KeV.

26. The process according to claim 20, wherein step (d) includes implanting a dopant of the second conductivity type with a dose in a range of approximately $10^{12}$ to approximately $10^{13}$ atoms per square centimeter.

27. The process according to claim 26, wherein step (d) includes implanting a dopant of the second conductivity type with a an energy of from approximately 100 KeV to approximately 200 KeV.

28. The process according to claim 20, wherein step (d) includes implanting a dopant of the second conductivity type with a an energy of from approximately 100 KeV to approximately 200 KeV.

29. A method of forming a semiconductor device, comprising the steps of:
   (a) forming a layer of a semiconductor material of a first conductivity type on a semiconductor substrate, the layer of the semiconductor material having a surface;
   (b) disposing portions of an insulated gate material and a photoresist material on portions of the surface of the layer of the semiconductor material to form covered portions of the surface of the layer of the semiconductor material exposed and exposed portions of the surface of the layer of the semiconductor material, the insulated gate material being formed from a gate oxide material and a polysilicon gate material; and
   (c) forming doped regions of a second conductivity type in first regions of the layer of the semiconductor material and channel regions of the second conductivity type in second regions of the semiconductor material under the portions of the insulated gate material without requiring thermal diffusion of dopants of the second conductivity type, the first regions being different than the second regions, the first regions having a thickness greater than the channel regions.

30. The process according to claim 29, wherein step (c) includes implanting dopants of a second conductivity type within the layer of the semiconductor material through the exposed portions of the layer of the semiconductor material.

31. The process according to claim 30, wherein step (c) includes implanting the dopants of the second conductivity type at an angle in a range from approximately 30° to approximately 55° relative to the surface of the layer of the semiconductor material.

32. The process according to claim 30, wherein step (c) includes implanting the dopants of the second conductivity type with a dose of from approximately $10^{12}$ to approximately $10^{13}$ atoms/cm$^2$.

33. The process according to claim 30, wherein step (c) includes forming the channel region by implanting the dopants of the second conductivity type with an energy from approximately 100 KeV to approximately 200 KeV.

34. The process according to claim 33, wherein step (c) includes implanting a dopant of the second conductivity type with a dose in a range of approximately $10^{12}$ to approximately $10^{13}$ atoms per square centimeter.

35. The process according to claim 31, wherein step (c) includes implanting a dopant of the second conductivity type with a dose in a range of approximately $10^{12}$ to approximately $10^{13}$ atoms per square centimeter.

36. The process according to claim 35, wherein step (c) includes implanting a dopant of the second conductivity type with a an energy of from approximately 100 KeV to approximately 200 KeV.

37. The process according to claim 31, wherein step (c) includes implanting a dopant of the second conductivity type with a an energy of from approximately 100 KeV to approximately 200 KeV.

38. A process for manufacturing a semiconductor device, comprising the steps of:
   (a) forming a layer of a semiconductor material of a first conductivity type on a semiconductor substrate, the layer of the semiconductor material having a surface;
   (b) disposing portions of a gate oxide material, a polysilicon gate material, and a photoresist material over portions of the surface of the layer of the semiconductor material to form covered portions of the surface of the layer of the semiconductor material and exposed portions of the surface of the semiconductor material;

(c) disposing a doped region of a second conductivity type within the layer of the semiconductor material without requiring thermal diffusion of a dopant, the doped region having a maximum thickness of less than 4 µm in a direction orthogonal to the surface of the layer of the semiconductor device, the doped region having a first dopant concentration; and (d) disposing a channel region of a second conductivity type within the layer of the semiconductor material without requiring thermal diffusion of a dopant, the channel region extending under the gate oxide material, the channel region having a second dopant concentration less than the first dopant concentration and having a thickness legs than the doped region.

39. The process according to claim 38, wherein step (c) includes disposing the doped region within the layer of the semiconductor material so that the maximum thickness of the doped region in a direction orthogonal to the surface of the layer of the semiconductor device being between 0.6 µm and 4 µm.

40. The process according to claim 38, wherein step (d) includes implanting a dopant of the second conductivity type with a dose in a range of approximately $10^{12}$ to approximately $10^{13}$ atoms per square centimeter.

41. The process according to claim 40, wherein step (d) includes implanting a dopant of the second conductivity type with a an energy of from approximately 100 KeV to approximately 200 KeV.

42. The process according to claim 38, wherein step (d) includes implanting a dopant of the second conductivity type with a an energy of from approximately 100 KeV to approximately 200 KeV.

43. The process according to claim 38, wherein step (d) includes implanting a dopant of the second conductivity type at an angle in a range from approximately 35° to approximately 60° relative to a direction orthogonal to the surface of the layer of the semiconductor material.

44. The process according to claim 43, wherein step (d) includes implanting a dopant of the second conductivity type with a dose in a range of approximately $10^{12}$ to approximately $10^{13}$ atoms per square centimeter.

45. The process according to claim 44, wherein step (d) includes implanting a dopant of the second conductivity type with a an energy of from approximately 100 KeV to approximately 200 KeV.

46. The process according to claim 43, wherein step (d) includes implanting a dopant of the second conductivity type with a an energy of from approximately 100 KeV to approximately 200 KeV.

47. A process for manufacturing a semiconductor device, comprising:

(a) providing a layer of a semiconductor material of a first conductivity type on a surface of a semiconductor substrate, the layer of the semiconductor material including a surface having portions of a gate oxide material, a polysilicon gate material, and a photoresist material disposed thereon to form covered portions of the surface of the layer of semiconductor material and exposed portions of the surface of the layer of the semiconductor material;

(b) disposing a doped region of a second conductivity type within the layer of the semiconductor material without requiring thermal diffusion of a dopant, the doped region having a first dopant concentration; and (c) disposing a channel region of a second conductivity type within the layer of the semiconductor material without requiring thermal diffusion of a dopant, the channel region extending under at least one of the portions of gate oxide material, the channel region having a second dopant concentration less than the first dopant concentration and having a thickness less than the doped region.

48. The process according to claim 47, wherein step (c) includes implanting a dopant of the second conductivity type at an angle in a range from approximately 35° to approximately 60° relative to a direction orthogonal to the surface of the layer of the semiconductor material.

49. The process according to claim 48, wherein step (c) includes implanting a dopant of the second conductivity type with a dose in a range of approximately $10^{12}$ to approximately $10^{13}$ atoms per square centimeter.

50. The process according to claim 49, wherein step (c) includes implanting a dopant of the second conductivity type with a an energy of from approximately 100 KeV to approximately 200 KeV.

51. The process according to claim 50, wherein step (b) includes disposing the doped region so that the doped region has a maximum thickness of less than 4 µm in a direction orthogonal to the surface of the layer of the semiconductor material.

52. The process according to claim 48, wherein step (b) includes disposing the doped region so that the doped region has a maximum thickness of less than 4 µm in a direction orthogonal to the surface of the layer of the semiconductor material.

53. The process according to claim 47, wherein step (b) includes disposing the doped region so that the doped region has a maximum thickness of less than 4 µm in a direction orthogonal to the surface of the layer of the semiconductor material.

* * * * *